United States Patent
De Souza et al.

(10) Patent No.: US 8,617,938 B2
(45) Date of Patent: Dec. 31, 2013

(54) DEVICE AND METHOD FOR BORON DIFFUSION IN SEMICONDUCTORS

(75) Inventors: Joel P. De Souza, Putnam Valley, NY (US); Marinus Hopstaken, Carmel, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 13/013,357

(22) Filed: Jan. 25, 2011

(65) Prior Publication Data

US 2012/0187539 A1   Jul. 26, 2012

(51) Int. Cl.
*H01L 27/00* (2006.01)

(52) U.S. Cl.
USPC .................................. 438/147; 257/E21.275

(58) Field of Classification Search
USPC .................... 257/147, E21.275; 438/147
See application file for complete search history.

(56) References Cited

U.S. PATENT DOCUMENTS

| | | | | |
|---|---|---|---|---|
| 5,156,981 A | * | 10/1992 | Kitagawa et al. | 438/133 |
| 5,223,442 A | * | 6/1993 | Kitagawa et al. | 438/137 |
| 5,264,378 A | * | 11/1993 | Sakurai | 438/138 |
| 5,281,552 A | | 1/1994 | King et al. | |

FOREIGN PATENT DOCUMENTS

WO   WO2011005433 A2   1/2011

OTHER PUBLICATIONS

Fair, R. "Physical Models of Boron Diffusion in Ultrathin Gate Oxides" J. Electrochem. Soc., vol. 144, No. 2. Feb. 1997. pp. 708-717.

Kessler, M., et al. "Charge Carrier Lifetime Degradation in CZ Silicon Through the Formation of a Boron-Rich Layer During BBR3 Diffusion Processes" Semiconductor Science and Technology. Apr. 2010. pp. 1-9.

Sarubbi, F., et al. "Chemical Vapor Deposition of a-Boron Layers on Silicon for Controlled Nanometer-Deep p+n Junction Formation" Journal of Electronic Materials, vol. 39, No. 2. Jul. 2009. pp. 162-173.

* cited by examiner

*Primary Examiner* — Howard Weiss
*Assistant Examiner* — Steven Rao
(74) *Attorney, Agent, or Firm* — Tutunjian & Bitetto, P.C.; Louis Percello

(57) ABSTRACT

A device and method for semiconductor fabrication includes forming a buffer layer on a semiconductor substrate and depositing an amorphous elemental layer on the buffer layer. Elements of the elemental layer are diffused through the buffer layer and into the semiconductor layer.

25 Claims, 5 Drawing Sheets

US 8,617,938 B2

DEVICE AND METHOD FOR BORON DIFFUSION IN SEMICONDUCTORS

BACKGROUND

1. Technical Field

The present invention relates to semiconductor fabrication and more particularly to a device and doping method which dopes a silicon based semiconductor with boron without the formation of an undesirable boron rich layer (BRL) at the substrate surface.

2. Description of the Related Art

Boron is a common doping element employed in semiconductor devices. The doping of silicon crystal with boron has been performed by many methods. These methods include implantation of elemental or molecular boron ions. Boron doping by solid state diffusion can be performed from spin-on deposited boron doped glass films or boric acid, $B_2O_3$ films deposited by chemical vapor deposition (CVD) or plasma enhanced CVD processes.

Other solid state diffusion methods include $B_2O_3$ films formed at a silicon surface via reaction of $BBr_3$ or $BCl_3$ vapor with oxygen gas in a furnace tube, $B_2O_3$ films provided by oxidation of BN materials, and amorphous Boron films (α-boron) deposited by CVD (chemical vapor deposition) on an oxide free silicon at temperatures above 500 degrees C. Still other methods include the growth of a boron doped silicon base semiconductor layer on top of a substrate by molecular beam epitaxy (MBE) or epitaxial growth by chemical vapor deposition at atmospheric pressure or at a reduced pressure.

There are severe drawbacks associated with each of the above mentioned boron doping methods. For example, ion implantation introduces crystal damage as a consequence of energy transfer in the stopping process of incoming ions. This leads to the displacement of the lattice silicon atoms. Depending on the implantation parameters like ion dose, ion energy and dose flux and on the parameters of the subsequent thermal processes, such as heating rate, gas composition in the furnace, etc., the implantation damage may evolve into secondary extended defects like dislocation loops and stacking faults. These extended defects severely degrade the electrical properties of p-n junctions and the minority carrier lifetime in the bulk.

The diffusion of boron from chemical sources like $BBr_3$, $BCl_3$, $B_2O_3$ or a-boron films in direct contact with a silicon based semiconductor may result in the formation of a boron silicon compound phase layer at the silicon surface, called a Boron Rich Layer (BRL). The BRL is known to be $SiB_6$. The thickness of the $SiB_6$ layer is governed by parameters like the temperature and time of the diffusion process, the concentration of oxygen in the gas mixture in the case of vapor chemical source diffusion, etc.

For heavy boron diffusion, extended crystal defects can be introduced in the bulk of the wafer induced by stresses associated with the presence of BRL. This is particularly detrimental for solar cell production which requires Boron doping for the creation of back-surface fields in solar cells with a p-type substrate or $p^+$-type emitters in solar cell with an n-type substrate, while maintaining a minority carrier lifetime at a high value.

The MBE method can produce a boron doped layer of high crystalline quality, however, in cases where the production cost is a key factor like in photovoltaic industry, this doping alternative is not feasible.

SUMMARY

A device and method for semiconductor fabrication includes forming a buffer layer on a semiconductor substrate and depositing a doped amorphous or polycrystalline Boron containing layer on the buffer layer. Boron atoms from the Boron containing layer are diffused through the buffer layer and into the semiconductor layer. After diffusion, the Boron containing layer may be removed, patterned or maintained on the buffer layer.

A method for semiconductor fabrication includes forming a silicon oxide layer on a silicon substrate, depositing an elemental Boron layer on the silicon oxide layer, diffusing elements of the Boron layer through the silicon oxide layer and into the silicon substrate and removing the Boron layer from the silicon oxide layer.

A semiconductor device includes a silicon substrate, and a doped region formed in the substrate. The doped region containing Boron atoms is diffused into the doped region through a buffer layer formed on the substrate. The doped region is totally free of a Boron-Rich Layer material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
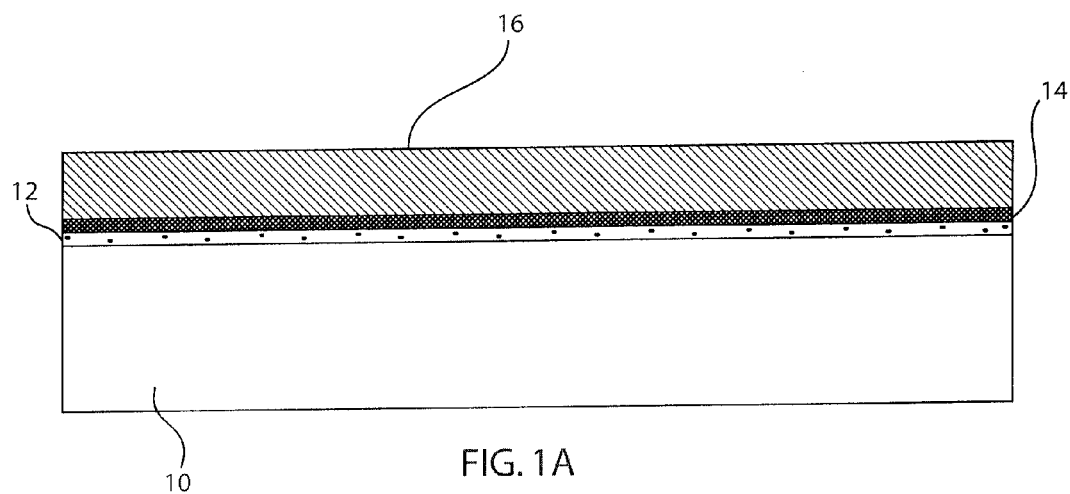
FIG. 1A is a cross-sectional view of a semiconductor device having a dopant diffused into a substrate in accordance with the present principles.

The present principles provide methods for low cost Boron doping that prevents the formation of a Boron Rich Layer (BRL) e.g., a $SiB_6$ phase. The methods provide a low cost device that does not suffer from the drawbacks of conventional devices. An amorphous or polycrystalline elemental layer, e.g., including Boron, is formed on a buffer layer which is in turn formed on a semiconductor material. Boron atoms from the layer are diffused into the buffer layer and then into the semiconductor. A supply of Boron atoms to the semiconductor is limited by the diffusivity in the buffer layer.

In one embodiment, the diffusivity of the atoms in the buffer layer may be selected to be less than the diffusivity of atoms in the semiconductor, and a segregation coefficient of the atoms at the buffer layer/semiconductor interface may be selected to be lower than 1. In this way, cost effective dopant diffusion may be provided with a high concentration of surface atoms and without the formation of undesirable species.

In one embodiment, Boron atoms are diffused into a silicon crystal from an elemental amorphous boron film. The Boron film is separated from the silicon substrate by a thin layer, e.g., a $SiO_2$ layer of for example, 10 nm in thickness. At high temperatures (e.g., above about 800 degrees Celsius), B atoms diffuse from the elemental B film into $SiO_2$ and then from the $SiO_2$ diffuse into silicon of a substrate. The supply of Boron atoms to silicon is governed by the Boron diffusivity in $SiO_2$ (e.g., diffusivity of B in $SiO_2$ is less than the diffusivity of B in Si) and by the segregation coefficient of Boron at the $SiO_2$—Si interface which is lower than 1 (at the $SiO_2$—Si interface the Boron concentration in the Si is 3 to 10 times lower than B concentration in the $SiO_2$ side).

It should be understood that the present embodiments will be illustratively described in terms of Si, $SiO_2$, and B; however, the present principles are not limited to these elements and compounds and other materials are contemplated in accordance with the present principles.

The flowchart and block diagrams in the Figures illustrate the architecture, functionality, and operation of possible implementations of methods according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and instructions.

It is to be understood that the present invention will be described in terms of a given illustrative architecture on a semiconductor wafer; however, other architectures, structures, substrate materials and process features and steps may be varied within the scope of the present invention.

Semiconductor circuits described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. In particularly useful embodiments, the present principles are employed to form photovoltaic devices or other integrated circuit devices.

Referring now to the drawings in which like numerals represent the same or similar elements and initially to FIG. 1A, a semiconductor wafer or substrate 10 is shown in accordance with one illustrative example. The substrate 10 may include a mono-crystalline bulk material, a semiconductor on insulator structure or any other suitable material or structure. In a preferred embodiment, substrate 10 may include crystalline Si, polycrystalline or multicrystalline silicon, single crystalline germanium or silicon germanium ($Si_xGe_{1-x}$), silicon carbide (SiC), etc. A buffer layer 12 is formed over the substrate 10. In one embodiment, the buffer layer 12 includes $SiO_2$. The buffer layer 12 may include a thickness of about 2-50 nm, although other thicknesses may be employed.

An elemental film 14 is deposited on the buffer layer 12. The elemental film 14 preferably includes B and, in particular, amorphous Boron ($\alpha$-Boron), although other dopant films may be employed, such as, e.g., heavily Boron doped amorphous or polycrystalline silicon or silicon-germanium films, etc. In a particularly useful embodiment, $\alpha$-Boron is formed from cracked $B_2H_6$ molecules by a plasma discharge in a plasma enhanced chemical vapor deposition (PECVD) reactor. The temperature of the semiconductor wafer 10 during the deposition process can be as low as 200 degrees Celsius. The deposition process may take only few seconds to deposit, e.g., a 5 nm thick $\alpha$-Boron film. It should be noted that the resulting boron concentration diffused into silicon (10) is insensitive to the thickness of $\alpha$-Boron film, since a film of only few nm thick can be considered an infinite Boron source.

An optional cap film 16 (e.g., $SiO_2$ or any other thermally stable dielectric film) may optionally be deposited on top of elemental film 14, in the same PECVD reactor or using a different deposition method. The cap film may be a few to several hundreds of nanometers thick (e.g., about 5-500 nm). It should be noted that the elemental film 14, the buffer layer 12 and/or the cap film 16 may be patterned or selectively formed on a surface of the substrate 10 as is desirable or needed for a given application or function.

The diffusion doping of elements from the elemental film 14 (e.g., B) into the substrate 10 (e.g., Si based semiconductor) may be performed at temperatures above about 800 degrees Celsius in a conventional furnace or in a rapid thermal anneal furnace. Diffusion is controlled by the diffusion time, diffusion temperature and thickness of the buffer layer 12 (e.g., interfacial oxide). Another parameter which influences the elemental diffusion in the case of B is the presence of $H_2$ in the furnace atmosphere. $H_2$ enhances the diffusivity of Boron in $SiO_2$. The presence of fluorine in oxide (buffer layer 12) also plays a role to enhance B diffusivity in a $SiO_2$ buffer layer (12). Both processes may be employed concurrently as well.

After diffusion is completed, the $\zeta$-Boron film 14 may be removed by a thermal oxidation of Boron, a dilute HF etching; by a chemical treatment in a mixture of $H_2SO_4$ and $HNO_3$ (e.g., 1:1 volume) followed by dilute HF etching; by plasma etching; etc. Boron oxidation at temperatures above 700 degrees Celsius followed by an HF etch is the preferred process to remove an $\alpha$-Boron layer.

In other embodiments, the Boron containing layer 14 may be left in place. The layer 14 may be used as anti-reflective coat in a solar cell, a chemical resistant layer to mask against chemical etching in lithography processes, etc. The buffer layer 12 will remain below the layer 14 in those areas where layer 14 is maintained.

The Boron doped substrate of FIG. 1A may be employed in a photovoltaic cell. Additional processing is performed to complete the photovoltaic device.

Figure 1B:
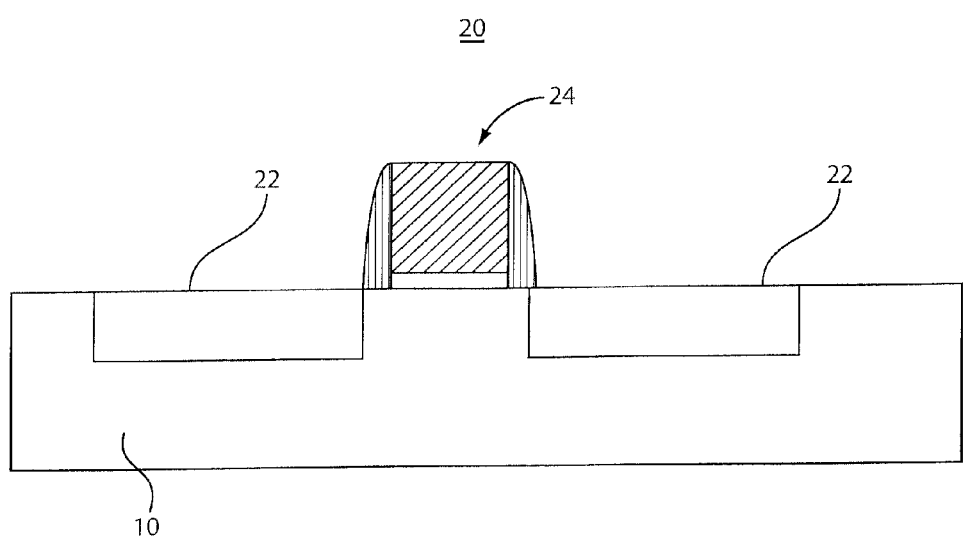
FIG. 1B is a cross-sectional view of an illustrative semiconductor device having a dopant diffused into a substrate in accordance with the present principles.

FIG. 1B shows an illustrative device 20 formed using the diffusion methods in accordance with the present principles. Device 20 includes a gate structure 24 having source and drain (S/D) regions 22 formed adjacent thereto. The substrate 10 may include one or more dopant regions, e.g., the S/D regions 22, wells, etc., formed in accordance with the present principles. The device structure is illustrative. Other structures are also contemplated.

Figure 2:
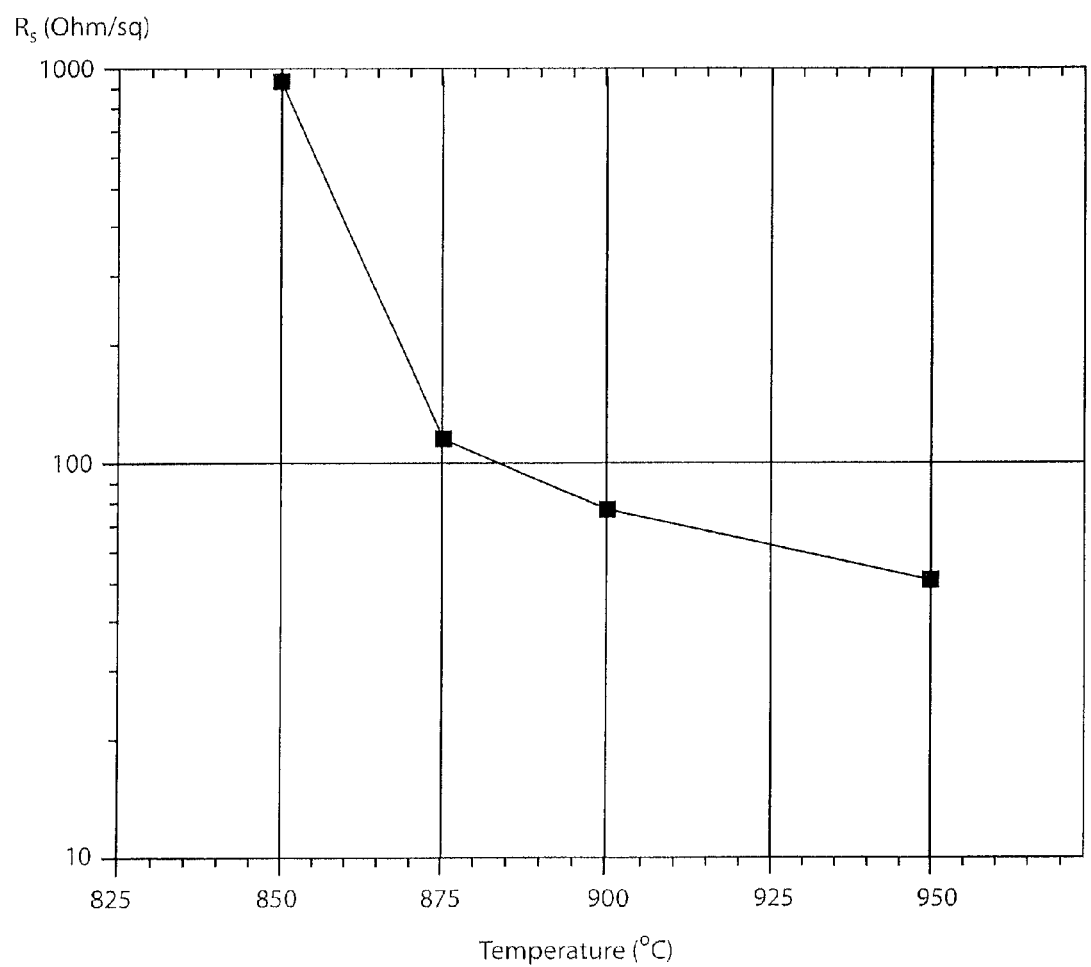
FIG. 2 is a plot of sheet resistance versus Boron diffusion temperature for an illustrative embodiment.

Referring to FIG. 2, sheet resistance ($R_s$ in Ohms per square) for Boron diffused into n-type silicon for 30 minutes versus diffusion temperature (degrees C.) in a nitrogen atmosphere is illustrated. The substrate was an n-type silicon wafer of resistivity of 15 Ohm-cm. An elemental α-Boron film (14) was 65 nm thick prepared by a PECVD method, the buffer layer 12 is an interfacial silicon dioxide film thermally grown on a silicon substrate with a thickness of 10 nm. The α-Boron film was capped with a 100 nm thick $SiO_2$ cap layer prepared by PECVD. As can be seen, the sheet resistance was reduced with higher diffusion temperature.

Figure 3A:
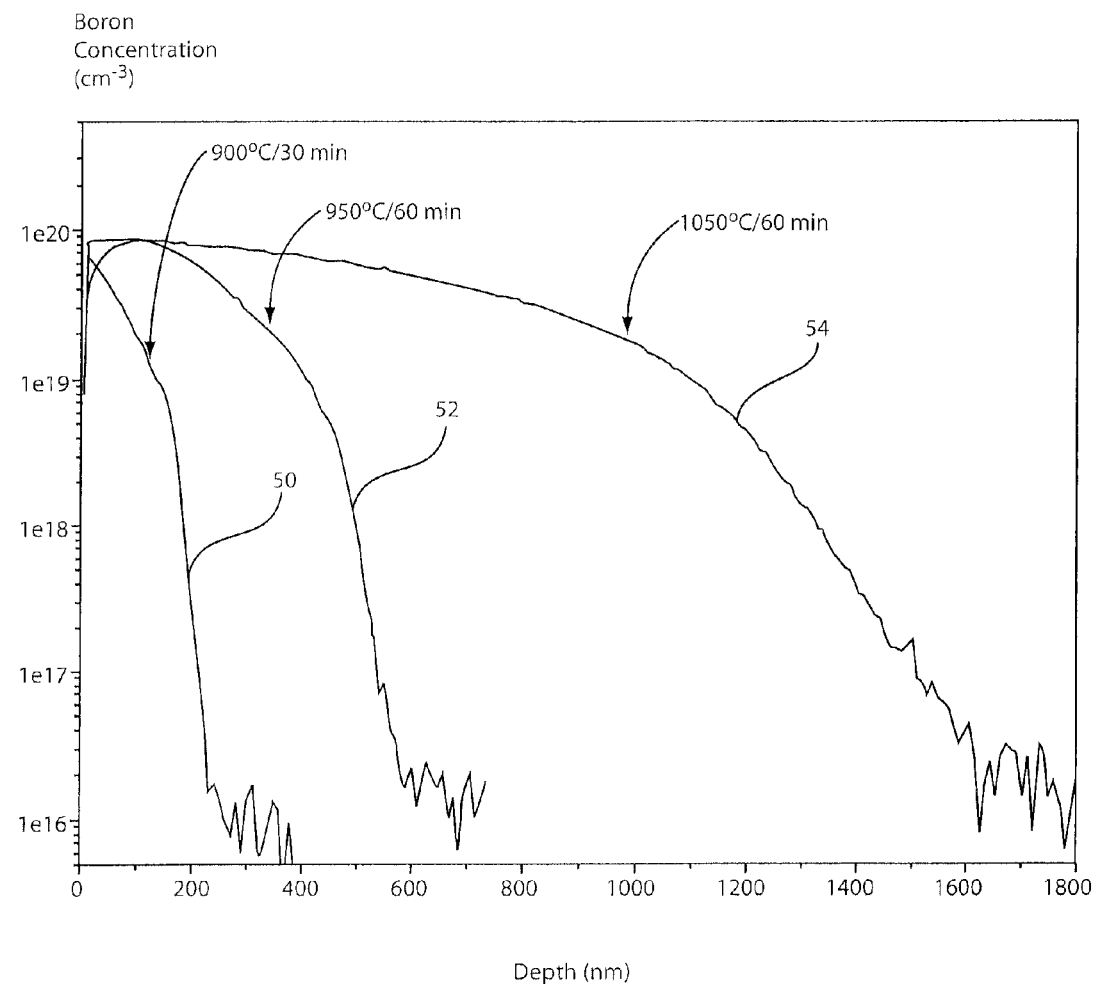
FIG. 3A is a plot of Boron depth profiles after diffusion in silicon obtained by secondary ion mass spectroscopy (SIMS) in samples where a buffer layer was employed in accordance with the present principles.

Referring to FIG. 3A, Boron depth profiles for Boron diffusion in samples produced in accordance with the present principles are shown. The profiles were generated using secondary ion mass spectrometry (SIMS). FIG. 3A shows Boron concentration versus depth into a substrate (e.g., an n-type silicon substrate). FIG. 3A includes three profiles: one profile 50 is for a diffusion temperature of 900 degrees Celsius for 30 minutes, another profile 52 is for a diffusion temperature of 950 degrees Celsius for 60 minutes and another profile 54 is for a diffusion temperature of 1050 degrees Celsius for 60 minutes (all in a nitrogen atmosphere). Profiles 50, 52 and 54 had an α-Boron layer deposited on the silicon substrate which was covered by a 10 nm thick $SiO_2$ layer.

The Boron profiles for the set of profiles 50, 52 and 54 show excellent control (e.g., diffused dose and diffusion length). There is no formation of a Boron Rich Layer (BRL). Other temperatures and times are also contemplated for diffusion.

Figure 3B:
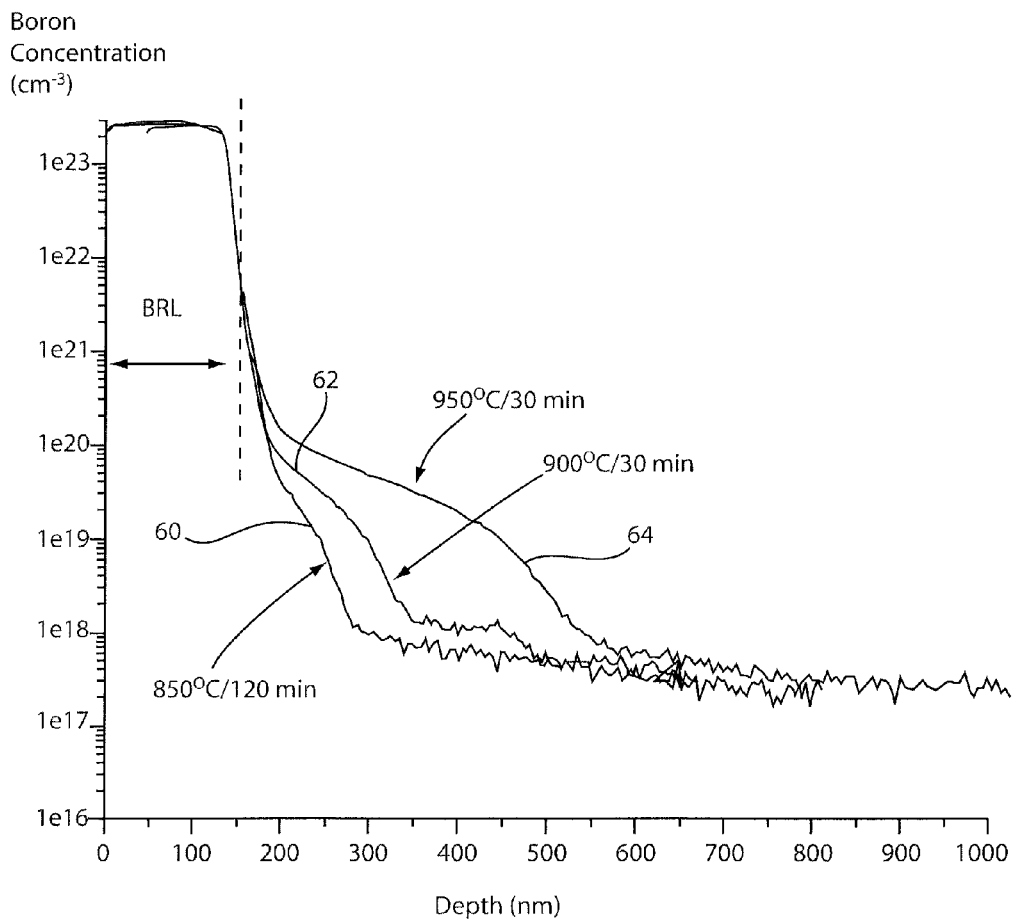
FIG. 3B is a plot of Boron depth profiles after diffusion in silicon obtained by secondary ion mass spectroscopy (SIMS) in samples with no buffer layer.

Referring to FIG. 3B, an α-Boron film was deposited on an oxide free silicon surface (no buffer layer). It is apparent in the boron profiles of FIG. 3B that a Boron Rich Layer (BRL) is present at the silicon surface denoted by the plateau at or near the silicon surface in the profiles. FIG. 3B includes three profiles: one profile 60 is for a diffusion temperature of 850 degrees Celsius for 120 minutes, another profile 62 is for a diffusion temperature of 900 degrees Celsius for 30 minutes and another profile 64 is for a diffusion temperature of 950 degrees Celsius for 30 minutes (all in a nitrogen atmosphere). The α-Boron layer was removed using the same method used for profiles are 50, 52 and 54.

Note that the BRL is absent in the boron depth profiles of FIG. 3A, which employed the buffer layer in accordance with the present principles. In addition, the concentration of diffused Boron in the crystal is increased at greater depths for the FIG. 3A samples.

Figure 4:
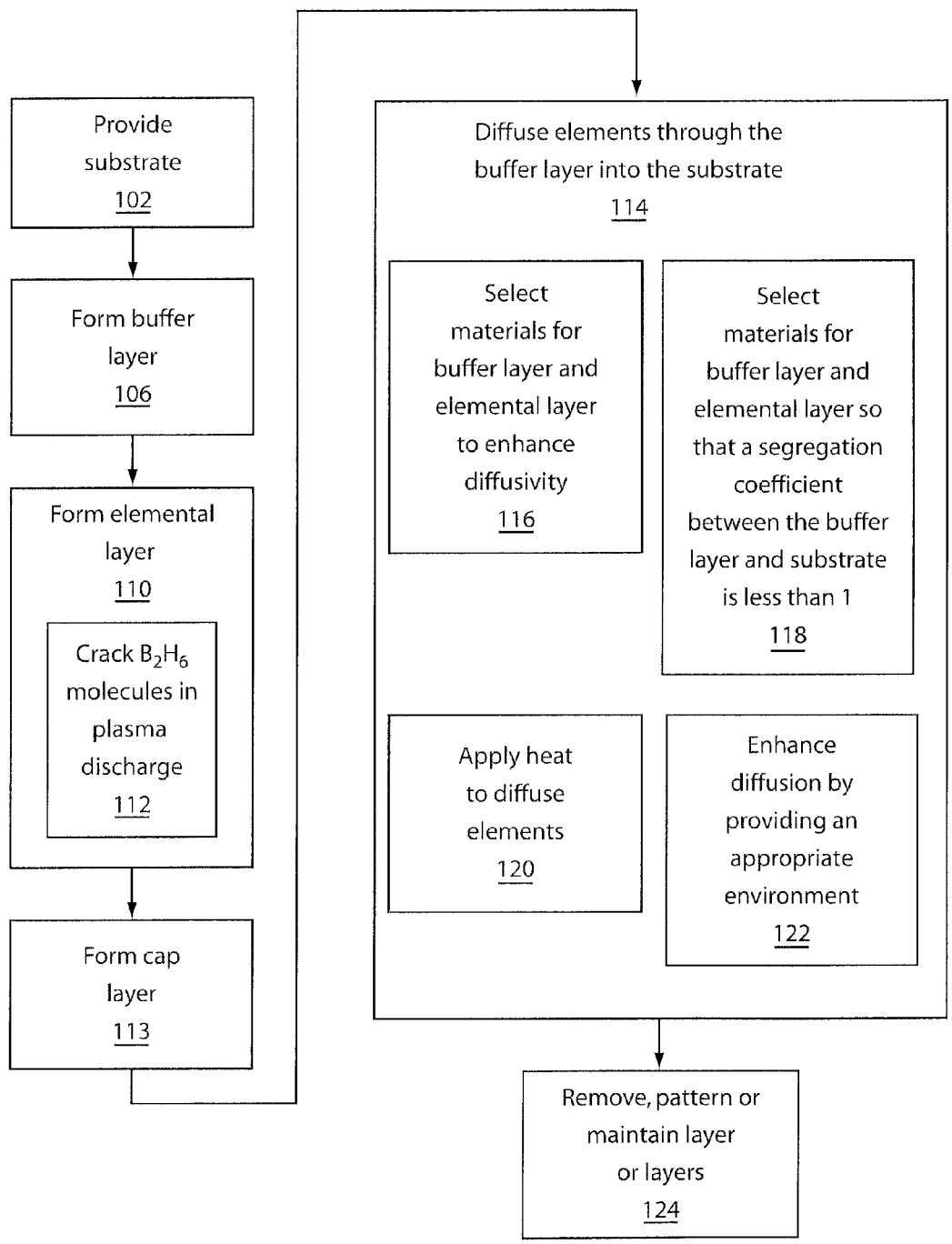
FIG. 4 is a block/flow diagram showing a low-cost method for diffusing Boron without formation of an undesirable Boron Rich Layer (BRL) in accordance with one illustrative invention.

Referring to FIG. 4, a method for semiconductor fabrication is illustrative shown in accordance with the present principles. In block 102, a semiconductor substrate or other material which is to be doped is provided. The semiconductor substrate may include a monocrystalline material, preferably silicon or including silicon, although other materials may be employed. It should be understood that the semiconductor substrate may be processed in advance with shallow trench isolation regions, other dopants, the formation of other structures, etc. In block 106, a buffer layer is formed on the semiconductor substrate. The buffer layer may be grown on the substrate, e.g., a silicon oxide, or may be deposited. In one embodiment, the oxide includes a thickness of between about 2 nm and 50 nm.

In block 110, a layer is deposited on the buffer layer, such as a Boron containing layer, e.g., amorphous or polycrystalline. The Boron containing layer may include amorphous elemental Boron, heavily Boron doped amorphous or polycrystalline Si or $Si_xGe_{1-x}$, etc. The amorphous elemental α-Boron layer may be formed by cracking $B_2H_6$ molecules in a plasma discharge in block 112. In block 113, a cap layer (for chemical protection) may be formed on the elemental layer. The cap layer may include a silicon oxide or the like.

In block 114, dopant elements of the elemental layer are diffused through the buffer layer and into the semiconductor layer. The diffusion in accordance with the present principles is aided by the selection of materials.

In block 116, the buffer layer and the elemental layer are preferably selected such that a diffusivity of the elements in the buffer layer is less than a diffusivity of the elements in semiconductor. In block 118, materials for the buffer layer and the elemental layer are preferably selected such that a segregation coefficient of the elements at the buffer layer—semiconductor interface is less than 1. In block 120, the diffusion is carried out by applying about 800 or more degrees Celsius to diffuse the elements into the semiconductor layer. In block 122, diffusion may be enhanced by providing an appropriate ambient atmosphere or chemistry in a processing chamber. E.g., in the case of B in a silicon oxide layer an atmosphere of $H_2$ and/or the presence of fluorine in a silicon oxide buffer layer may be employed to enhance diffusion. In block 124, the cap layer, if present, is removed from the Boron containing layer. The elemental layer (Boron containing layer) may be removed from the buffer layer, or the elemental layer may be left in place or patterned as needed.

The elemental layer can also be removed in only selected areas, via exposing its surface (e.g., by etching the cap layer at certain locations) to allow localized oxidation of the Boron layer. An HF etch will remove the oxidized boron, while the Boron layer is preserved in areas where it is still covered by the cap layer. This process can be done before or after boron diffusion. Processing may continue as needed.

Having described preferred embodiments of a device and method for elemental Boron diffusion in silicon and silicon compound semiconductors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor fabrication, comprising:
   forming a buffer layer on a semiconductor layer;
   depositing an amorphous or polycrystalline elemental layer on the buffer layer; and
   diffusing elements of the elemental layer through the buffer layer and into the semiconductor layer, wherein said elements are diffused through material forming the buffer layer and thereby reach and diffuse through the semiconductor layer.

2. The method as recited in claim 1, wherein forming a buffer layer includes forming an oxide of the semiconductor layer.

3. The method as recited in claim 2, wherein the oxide includes a thickness of between about 2 nm and 50 nm.

4. The method as recited in claim 1, wherein depositing an amorphous or polycrystalline elemental layer on the buffer layer includes depositing an amorphous Boron layer on a silicon dioxide buffer layer.

5. The method as recited in claim 1, wherein diffusing elements of the elemental layer through the buffer layer and into the semiconductor layer includes applying at least 800 degrees Celsius to diffuse the elements into the semiconductor layer.

6. The method as recited in claim 1, wherein diffusing elements of the elemental layer through the buffer layer and into the semiconductor layer includes selecting materials for the buffer layer and the elemental layer such that a diffusivity of the elements in the buffer layer is less than a diffusivity of the elements in semiconductor.

7. The method as recited in claim 1, wherein diffusing elements of the elemental layer through the buffer layer and into the semiconductor layer includes selecting materials for the buffer layer and the elemental layer such that a segregation coefficient of the elements at the buffer layer—semiconductor interface is less than 1.

8. The method as recited in claim 1, further comprising forming a cap layer on the elemental layer.

9. The method as recited in claim 1, wherein the amorphous elemental layer includes a-Boron formed by cracking $B_2H_6$ molecules in a plasma discharge.

10. A method for semiconductor fabrication, comprising:
   forming a silicon oxide layer on a silicon substrate;
   depositing an elemental Boron layer on the silicon oxide layer; and
   diffusing elements of the Boron layer through the silicon oxide layer and into the silicon substrate, wherein said elements are diffused through material forming the silicon oxide layer and thereby reach and diffuse through the silicon substrate.

11. The method as recited in claim 10, wherein diffusing elements of the Boron layer includes enhancing diffusivity of Boron in the silicon oxide layer in an atmosphere containing $H_2$ or doping the buffer layer with fluorine.

12. The method as recited in claim 10, wherein the silicon oxide includes a thickness of between about 2 nm and 50 nm.

13. The method as recited in claim 10, wherein diffusing elements includes applying at least 800 degrees Celsius to diffuse the elements into the silicon dioxide layer and the silicon substrate.

14. The method as recited in claim 10, wherein diffusing elements includes selecting materials such that a diffusivity of the elements in the silicon dioxide layer is less than a diffusivity of the elements in the semiconductor substrate.

15. The method as recited in claim 10, wherein diffusing elements includes selecting materials such that a segregation coefficient of the elements at the silicon dioxide—semiconductor substrate interface is less than 1.

16. The method as recited in claim 10, further comprising forming a cap layer on the Boron layer.

17. The method as recited in claim 10, wherein the elemental Boron layer includes a-Boron formed by cracking $B_2H_6$ molecules in a plasma discharge.

18. A semiconductor device, comprising:
   a silicon substrate;
   a silicon oxide buffer layer that is above the silicon substrate; and
   a doped region formed in the substrate, the doped region containing Boron atoms diffused into the doped region through the buffer layer formed on the substrate, wherein the doped region is totally free of a Boron-Rich Layer material and wherein a concentration of Boron in the buffer layer at an interface between material forming the buffer layer and the doped region of the substrate is greater than a concentration of Boron in the doped region at the interface.

19. The device as recited in claim 18, wherein the semiconductor device is included in a photovoltaic cell.

20. The device as recited in claim 18, wherein the buffer layer includes silicon dioxide.

21. The device as recited in claim 18, wherein a diffusivity of Boron in the buffer layer is less than a diffusivity of Boron in the silicon substrate.

22. The device as recited in claim 18, wherein a segregation coefficient of the Boron at the buffer layer—silicon substrate interface is less than 1.

23. The device as recited in claim 18, wherein the buffer layer includes a thickness of between about 2 nm and 50 nm.

24. The device as recited in claim 18, further comprising a Boron containing layer formed on the buffer layer.

25. The device of claim 24, wherein the Boron containing layer includes a-Boron.

* * * * *